US008797509B2

(12) United States Patent
Seijger et al.

(10) Patent No.: US 8,797,509 B2
(45) Date of Patent: Aug. 5, 2014

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Olav Johannes Seijger, Eindhoven (NL); Martinus Joseph Kok, Eindhoven (NL); Sander Kerssemakers, Eindhoven (NL); Mark Johannes Magielsen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 810 days.

(21) Appl. No.: 12/993,460

(22) PCT Filed: May 26, 2009

(86) PCT No.: PCT/EP2009/056365
§ 371 (c)(1),
(2), (4) Date: Mar. 2, 2011

(87) PCT Pub. No.: WO2009/144218
PCT Pub. Date: Dec. 3, 2009

(65) Prior Publication Data
US 2011/0141449 A1 Jun. 16, 2011

Related U.S. Application Data

(60) Provisional application No. 61/071,982, filed on May 29, 2008.

(51) Int. Cl.
*G03B 27/58* (2006.01)
(52) U.S. Cl.
USPC .................................. 355/72; 355/53; 355/77
(58) Field of Classification Search
USPC ............. 355/30, 53, 72, 77; 318/518.17, 561, 318/590, 592, 593, 595, 648, 649, 651, 640, 318/623, 611; 310/51; 364/474.28, 474.3
See application file for complete search history.

(56) References Cited

U.S. PATENT DOCUMENTS 5,760,564 A * 6/1998 Novak .......................... 318/687
6,020,710 A   2/2000 Lee
(Continued)

FOREIGN PATENT DOCUMENTS

EP   1 111 469 A    6/2001
EP   1 628 164 A2   2/2006

OTHER PUBLICATIONS

International Preliminary Report on Patentability with the Written Opinion of the International Searching Authority directed to related International application No. PCT/EP2009/056365, mailed on Dec. 9, 2010, The International Bureau of WIPO, Geneva, Switzerland; 8 pages.

(Continued)

*Primary Examiner* — Steven H Whitesell Gordon
*Assistant Examiner* — Mesfin T Asfaw
(74) *Attorney, Agent, or Firm* — Sterne, Kessler, Goldstein & Fox P.L.L.C.

(57) ABSTRACT

A substrate table positioning device that is supported by four bearing elements is provided. The substrate table positioning device also includes a balance mass. Two of the bearing elements support the base frame in such a way that they can move in a vertical direction independently of the other bearing elements. This can be achieved by using a hinge. This structure of substrate table positioning device has a higher lowest Eigen frequency of oscillation than that of substrate table positioning devices supported by three bearing elements. As such, the balance mass is not excited by typical vibrations that occur in the lithographic apparatus. This enables better positional control of the substrate table. It also enables at least some of the dimensions of the frame elements of the balance mass to be reduced.

19 Claims, 5 Drawing Sheets

(56) References Cited

U.S. PATENT DOCUMENTS

| | | |
|---|---|---|
| 2004/0036035 A1 | 2/2004 | Patrick Kwan et al. |
| 2005/0180666 A1 | 8/2005 | Ahn et al. |
| 2005/0190351 A1* | 9/2005 | Cox et al. .................. 355/53 |
| 2006/0110665 A1* | 5/2006 | Bleeker et al. ............. 430/22 |

OTHER PUBLICATIONS

International Search Report directed to related International Patent Application No. PCT/EP2009/056365, mailed Sep. 16, 2009; 3 pages.

* cited by examiner

INSPECTION METHOD AND APPARATUS, LITHOGRAPHIC APPARATUS, LITHOGRAPHIC PROCESSING CELL AND DEVICE MANUFACTURING METHOD

CROSS-REFERENCE TO RELATED APPLICATIONS

This application claims the benefit of U.S. provisional application 61/071,982, which was filed on May 29, 2008, and which is incorporated herein in its entirety by reference.

FIELD

The present invention relates to methods of inspection usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

It is often desirable to measure various parameters of the substrate at various stages during its manufacture. In order to achieve this, a substrate inspection unit is desired in the track around which the substrate is moved by a robot to perform the different resist processes.

The space available in the track is very limited. Furthermore, the reach of the robot arm is also limited. Providing an inspection device, and in particular arranging an inspection device so as to be able to accept a substrate table from a robot arm and move the substrate table within the inspection device, is thus very difficult within the confines of the track. These issues can be exacerbated in pre-existing tracks, to which it may be desirable to add an inspection device.

SUMMARY

It is desirable to provide apparatus for positioning a substrate table that has a compact structure and/or can accept a substrate table from a robot arm with limited range and/or extent of movement. Furthermore, it is desirable for the apparatus to isolate the substrate from receiving or transmitting vibration.

According to an aspect of the invention, there is provided a substrate table positioning device including a balance mass; first, second, third, and fourth bearing elements configured to movably support the balance mass on a base frame; and a hinge element provided between the balance mass and the first and second bearing elements, the hinge element configured to allow the first and second bearing elements to move independently of the other bearing elements.

According to another aspect of the invention, there is provided a substrate positioning device for a lithographic apparatus including: the substrate table positioning device defined above; a substrate table configured to support a substrate; a base frame; and A positioner configured to position the substrate table by exerting forces between the balance mass and the substrate table.

According to another aspect of the invention, there is provided an inspection apparatus for inspecting substrates, the inspection apparatus including: the substrate positioning device defined above; a radiation device configured to irradiate a substrate supported by the substrate table; a detector configured to receive radiation originating from the radiation device that has been scattered by the substrate; and a processor configured to analyze the received radiation, wherein the positioner is configured to move the substrate table relative to the radiation device, so as to be able to change a portion of the substrate that is irradiated.

According to another aspect of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a projection system configured to project the patterned radiation beam onto a target portion of the substrate; and the substrate positioning device defined above, wherein: the positioner is configured to move the substrate table relative to the projection system, so as to be able to change the portion of the substrate that is the target portion.

According to another aspect of the invention, there is provided a lithographic cell including: a coater configured to coat substrates with a radiation sensitive layer; a lithographic apparatus configured to expose images onto the radiation sensitive layer of substrates coated by the coater; a developer configured to develop images exposed by the lithographic apparatus; and an inspection apparatus as defined above.

According to another aspect of the invention, there is provided a device manufacturing method including: transferring a pattern from a patterning device onto a target portion of a substrate; and positioning the substrate using the substrate positioning device defined above so as to be able to change the portion of the substrate that is the target portion.

According to another aspect of the invention, there is provided a substrate inspection method including: irradiating a substrate that is supported by a substrate table; detecting radiation that has been scattered by the substrate; analyzing the detected radiation; and positioning the substrate using the substrate positioning device defined above so as to change the portion of the substrate being inspected.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
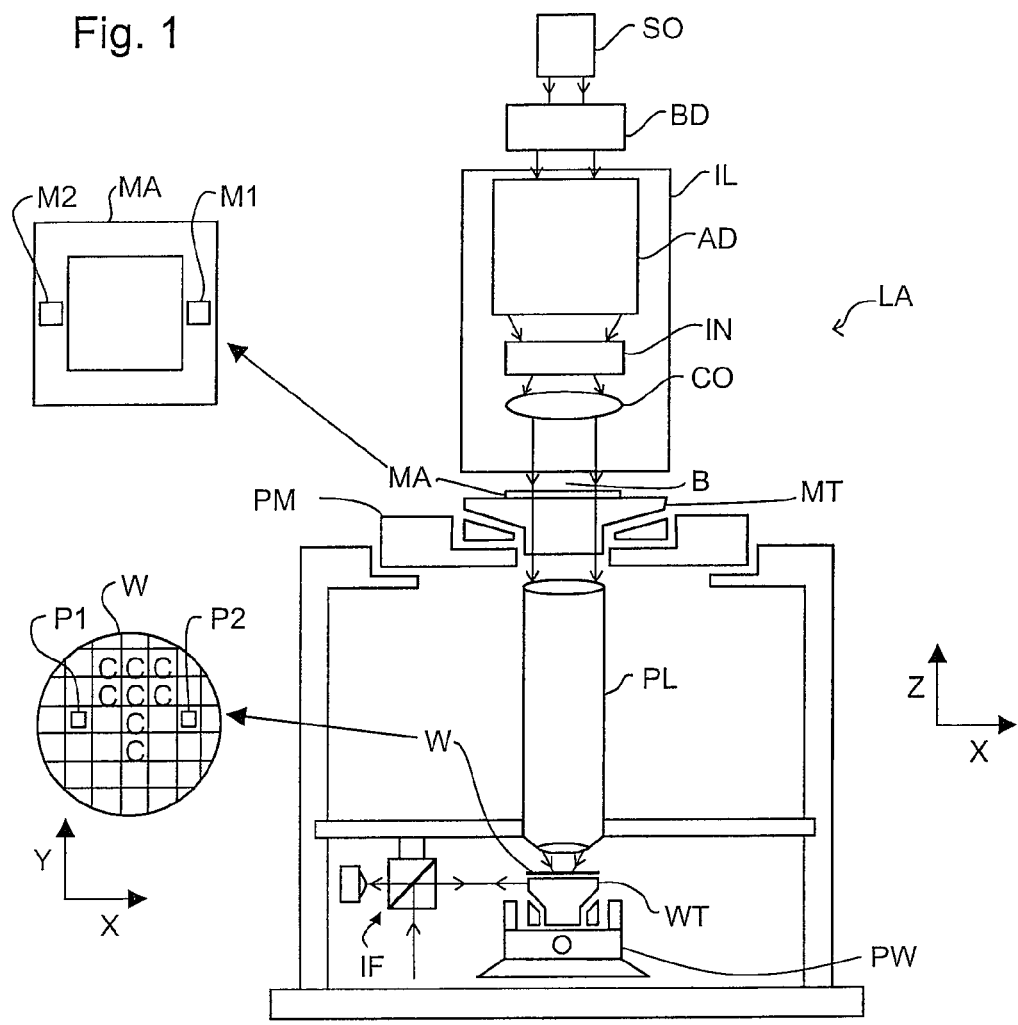
FIG. 1 depicts a lithographic apparatus in accordance with an embodiment of the invention.

FIG. 1 schematically depicts a lithographic apparatus. The apparatus includes an illumination system (illuminator) IL configured to condition a radiation beam B (e.g. UV radiation or DUV radiation); a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
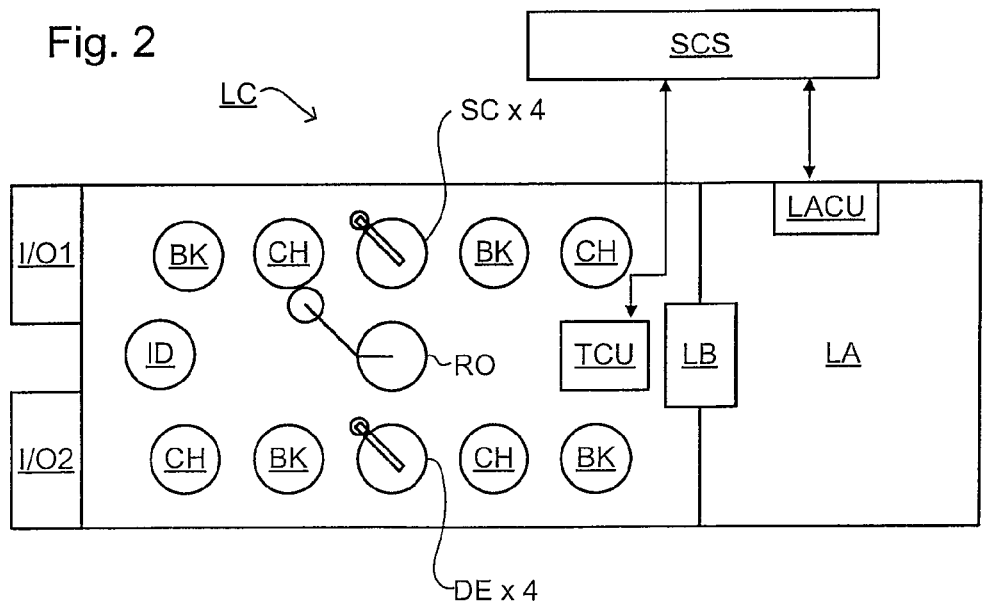
FIG. 2 depicts a lithographic cell or cluster in accordance with an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. In FIG. 2, an inspection apparatus ID is shown to be incorporated into a lithocell LC. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
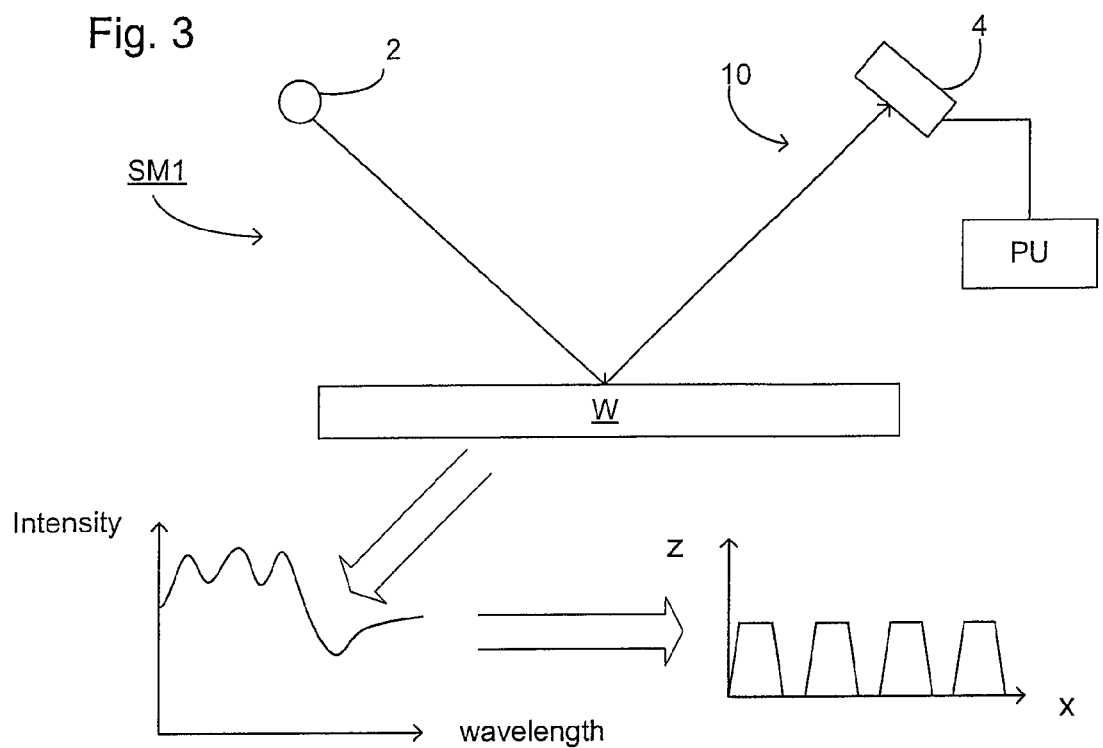
FIG. 3 depicts a scatterometer in accordance with an embodiment of the invention.

FIG. 3 depicts a scatterometer SM1 which may be used in an embodiment of the present invention. It includes a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
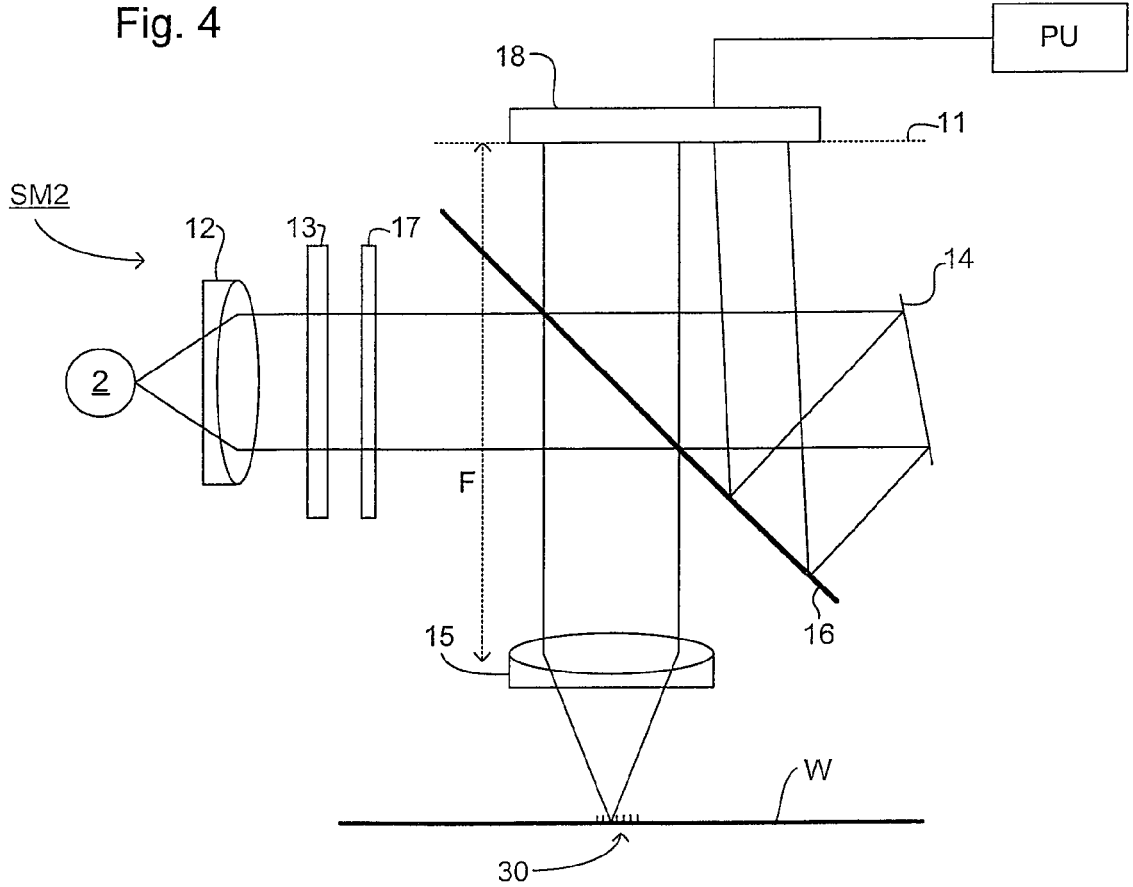
FIG. 4 depicts a scatterometer in accordance with an embodiment of the invention.

Another scatterometer that may be used with an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than including a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized light.

Using a broadband radiation source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\delta\lambda$ and a spacing of at least 2 $\delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit (or processor) PU, from knowledge of the printing step and/or other scatterometry processes.

As stated above, it is often desirable to inspect the substrate W after exposure and/or after processing. Thus, the ability to transfer the substrate W onto a substrate inspection device that can be accessed from the track of the lithographic cell LC is beneficial. This requires an inspection device ID to be incorporated into the lithographic cell LC in such a manner that a substrate can be transferred to it using the substrate handler RO. Such an arrangement is shown in FIG. 2. However, this arrangement may be difficult to achieve. This is because space inside the lithographic cell LC is limited. Furthermore, design constraints on the substrate handler RO (for example constraints relating to its rigidity) mean that its reach is limited. Thus, in order for a substrate W to be capable of being transferred to an inspection device ID using the substrate handler RO, it is desirable to carefully control the dimensions of the inspection device, and the dimensions of certain component parts of it.

Figure 5:
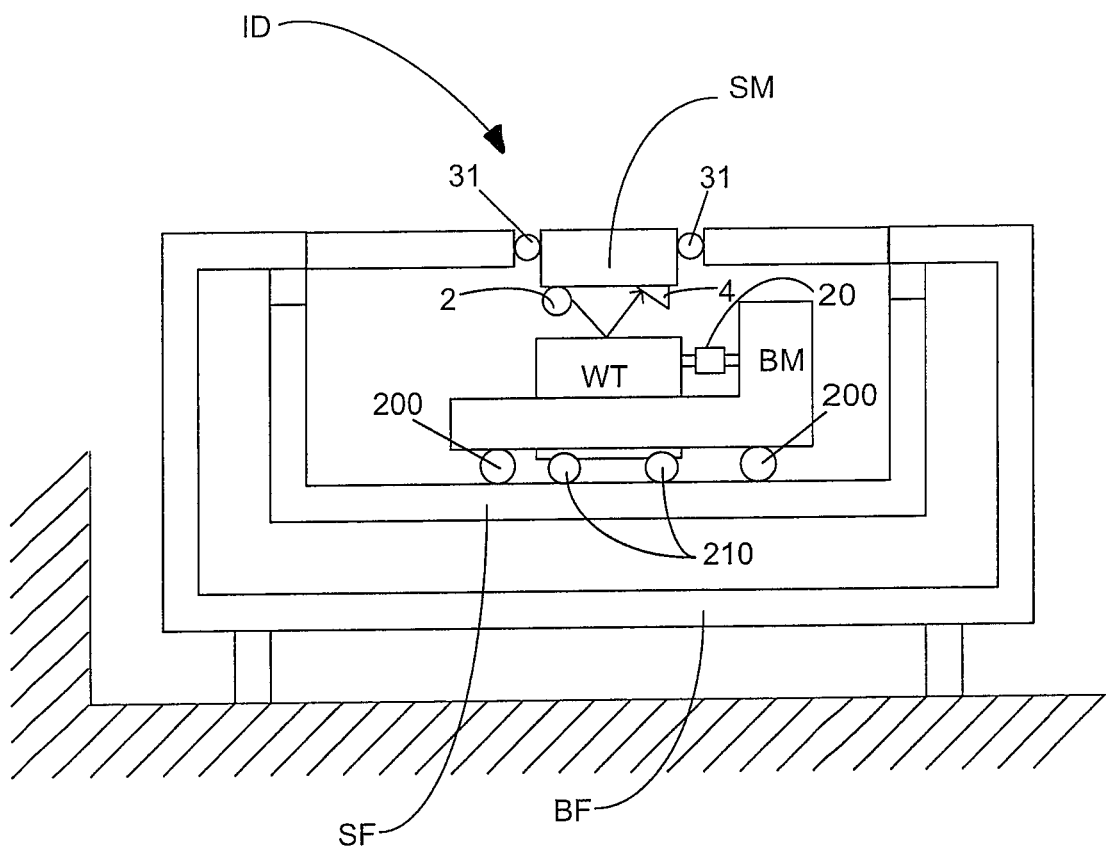
FIG. 5 depicts an inspection device including a substrate table positioning device according to an embodiment of the present invention.
Figure 5:
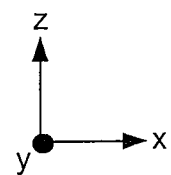

A schematic of an inspection device ID in accordance with an embodiment of the invention is shown in FIG. 5. The inspection device ID shown in FIG. 5 has a scatterometer SM. The scatterometer SM shown is the scatterometer SM1 described above in relation to FIG. 3, but any other scatterometer could be used, such as the scatterometer SM2 described above in relation to FIG. 4. The inspection device ID also has a substrate table WT on which the substrate W being inspected is held.

During inspection of the substrate W, the substrate table WT and the scatterometer SM are moved relative to each other. The relative movement is in the horizontal plane, which is the plane defined by the x- and y-axes in FIG. 5. This enables different areas of the substrate W to be inspected. Preferably, the substrate table WT is configured to move in one direction (for example, the x-axis as shown in FIG. 5), and the scatterometer SM is configured to move in a perpendicular direction (for example the y-axis in FIG. 5). The motion of the substrate table WT and the scatterometer SM can be caused by an actuator.

In alternative arrangements, one of either the scatterometer SM or the substrate table WT could be fixed in place, and the other of the scatterometer SM or the substrate table WT could be configured to move any direction in the horizontal plane. In the arrangement shown in FIG. 5, the scatterometer SM is mounted in a base frame BF via bearing elements 31 such that it can move in the y-axis direction. The base frame BF is typically part of the lithographic cell structure.

It is desirable that, during the measurement process, there is no unwanted movement of the substrate W relative to the scatterometer SM. Such unwanted movement could result from, for example, vibrations transferred to and/or from the substrate table WT. For example, unwanted vibrations could be transferred between the substrate table WT and the scatterometer SM, through, for example the base frame BF. In order to inspect different portions of the substrate W, the substrate table WT is typically moved relative to the scatterometer. This relative movement could be one source of unwanted vibration that needs to be controlled.

In order to minimize the disturbance forces transmitted between and/or to the substrate table WT and the scatterometer SM, a balance mass BM is provided. The balance mass BM is supported by bearing elements 200 on a substrate table support frame SF. The substrate table WT may be supported by bearing elements 210 on the substrate table support frame SF. The substrate table support frame SF may be rigidly connected to the base frame BF. Alternatively a Vibration Isolation System may be located between the base frame BF and the substrate support frame SF. Both stages WT and SM are mounted to the substrate support frame SF and mechanically isolated as a single complete unit with relation to the base frame BF. The bearing elements 200 allow substantially frictionless translational movement of the balance mass BM in the x- (and optionally y-) direction shown in FIG. 5 i.e. in a horizontal plane. Any suitable bearing elements could be used. For example, aerostatic bearings, hydrostatic bearings, or magnetic bearings could be used.

The substrate table WT is connected to the balance mass BM by a positioning actuator 20. The positioning actuator may be broadly termed a positioner. The positioning actuator 20 is used to position the substrate table WT relative to the scatterometer SM. This enables different portions of the substrate W positioned on the substrate table WT to be inspected, as explained above. The actuator 20 thus enables the substrate W to be moved, via the substrate table WT, in the x-direction. In other embodiments, a similar actuator may be provided to enable the scatterometer SM to be moved in the y-direction. Alternatively, more than one actuator 20 may be provided in order to ensure that the substrate W can be moved relative to the scatterometer SM in any direction in the horizontal plane.

As stated above, the actuator 20 is connected to both the substrate table WT and the balance mass BM. In accordance with Newton's Laws of Motion, if a force is exerted by the actuator 20 to move the substrate table WT in a certain direction, then an equal and opposite force is exerted on the balance mass BM. Thus, the balance mass BM moves in the opposite direction to the substrate table WT. Because the balance mass BM is supported on the substrate table support frame SF via substantially frictionless bearings 200, the motion of the balance mass BM (and any associated vibrations) is not transferred to the substrate table support frame SF. Thus, the motion of the substrate table WT is independent of the scatterometer SM. As such, no unwanted motion of the scatterometer SM results from the motion of the substrate table WT.

Because of the configuration described above, in which the positioning actuator 20 is connected to a balance mass BM as well as the substrate table WT, any vibrations in the substrate table support frame SF are not transferred to the substrate table WT or vice versa. Thus, any motion of the scatterometer SM can be independent of the motion of the substrate table WT. As such, no unwanted vibrations pass from the scatterometer SM to the substrate table WT, or vice versa.

Typically, the balance mass BM has significantly greater mass than the substrate table WT. For example, the balance mass BM could have 5 times the mass of the substrate table WT. This means that the motion of the balance mass BM is significantly less than the motion of the substrate table WT (in inverse proportion to the ratio of their masses). This means that, for example, the overall size of the inspection device ID can be reduced. In order to reduce further the unwanted transmission of vibrations to and from the substrate table WT, the centre of gravity of the substrate table WT and the balance mass BM can be aligned in the x-, y-, and/or z-axis directions.

The combination of the balance mass BM and the bearings 200 on which it is supported may be referred to herein as a positioning device, or a substrate table positioning device. However, it will be understood that the substrate W itself is actually positioned by using the actuator 20 to position the substrate table WT.

Figure 6:
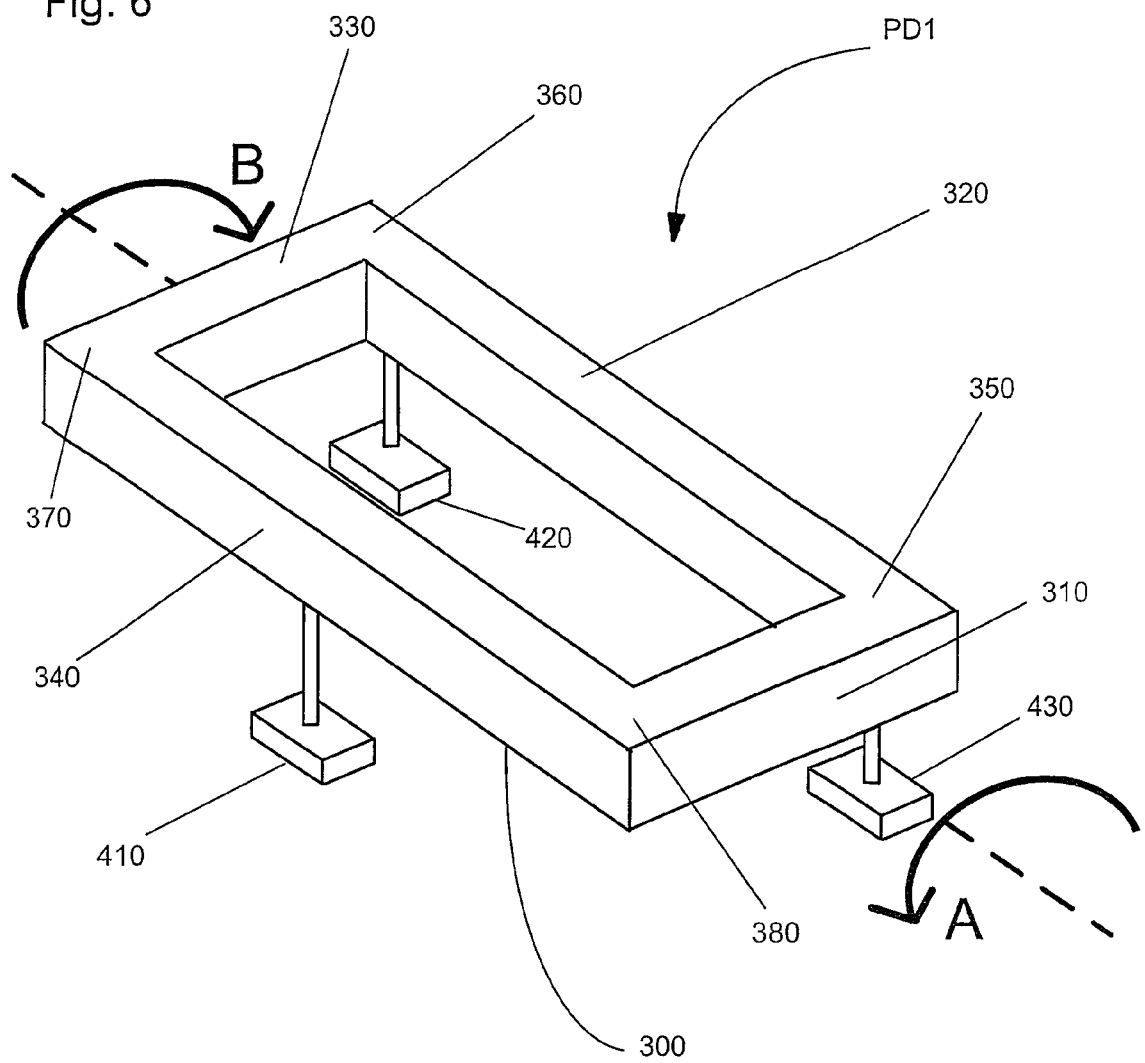
FIG. 6 depicts a substrate table positioning device in accordance with an embodiment of the invention.

A schematic of a substrate table positioning device PD1 is shown in FIG. 6. The substrate table positioning device PD1 shown in FIG. 6 includes a balance mass 300 supported on three substantially frictionless bearings 410, 420 and 430.

The balance mass 300 includes a rectangular frame lying generally in a plane. The rectangular frame has four sides 310, 320, 330 and 340. The rectangular frame of the balance mass 300 also has four corners 350, 360, 370 and 380.

Because the balance mass 300 shown in FIG. 6 is supported on three bearings 410, 420 and 430, the bearing system is statically determined. For any given set of forces applied to and/or created by the balance mass 300, there is only one solution for the force provided by each of the bearings 410, 420 and 430 that is required to support the balance mass 300. Thus, the motion of, and forces acting on, the balance mass 300 can be calculated with certainty.

The three bearing support system of the substrate table positioning device PD1 shown in FIG. 6 has a low Eigen frequency in a torsional mode of oscillation. Thus, the balance mass 300 may be excited to oscillate in a manner shown by arrows A and B at a relatively low frequency (the arrows A and B representing the motion of the width-wise frame members 310, 330 of the balance mass 300). Indeed, the Eigen frequency of this mode of oscillation may be low enough to be excited by movement and/or vibration of the elements of the lithographic apparatus LA. For example, this mode of oscillation may be excited by motion of the substrate table WT resulting from positioning actuator 20. By way of clarification, the torsional oscillation mode indicated by arrows A and B represents a mode in which opposite corners of the rectangular framed balance mass 300 move in the same z-direction at any given time during the oscillation, but in the opposite z-direction to neighbouring corners. Thus, the opposite corners 360 and 380 move in the same z-direction, and the opposite corners 350 and 370 move in the same z-direction. The balance mass 300 may be directly connected to the substrate table WT by, for example, an actuator 20 (as shown in the embodiment of FIG. 5). Furthermore, the balance mass 300 may exert forces through the bearing 200 onto the substrate table support frame SF and baseframe BF. These forces may be unwantedly transferred onto the substrate table WT. Thus, any unwanted motion of the balance mass 300 may be transferred to the substrate table WT. Thus, a torsional oscillation of balance mass 300, such as that described above, could be passed to the substrate table WT. This could result in unwanted vibration, movement or oscillation of the substrate table WT. As explained above, such unwanted movement of the substrate table WT, and thus of the substrate W, can lead to errors in the measurements performed by inspection device ID.

The actuators 20 are not directly mechanically coupled between the substrate table WT and the balance mass 300. In an embodiment the actuators comprise coils which are on the WT and magnet tracks located at the balance mass 300. In operation, a contactless magnetic force is excerted between the coils and the magnets which magnetic force moves the substrate table WT with respect to the balance mass 300.

In order to reduce the motion of the balance mass 300 due to the torsional oscillation described above, the width-wise frame members 310, 330 (i.e. those that have their longitudinal axis lying along the y-axis in the example shown in FIG. 6) need to be very rigid. Thus, in the balance mass 300 of FIG. 6, those frame members 310, 330 are very large, bulky and/or thick.

Any attempt to reduce the size of the width-wise frame members 310, 330 leads to unacceptable levels of motion resulting from the torsional oscillation. However, it is desirable to reduce the dimensions of these frame members 310, 330. For example, this may allow the substrate table WT to be passed underneath, or over the top of these frame members 310, 330 in order to be located in position. This is particularly important when faced with the spatial constraints associated with inserting an inspecting device ID into a track of a lithographic cell LC, and the constraints associated with having a substrate handler RO that has limited extent of reach.

As stated above, the substrate table positioning device PD1 which is supported on three bearings 410, 420, 430 exhibits a torsional mode of oscillation at an Eigen frequency that is low enough to be excited by typical movements in the lithographic apparatus. One way of reducing, or eliminating, this torsional mode of oscillation is to incorporate an extra bearing, such that the balance mass BM is supported by four bearings, rather than three bearings. However, simply inserting an extra bearing would result in a statically indeterminate bearing support structure. Thus, simply adding an extra bearing would mean that one of the bearings may not be supporting the balance mass at any given time. For example, if the bearings were air bearings, then these would operate typically at a gap of about 10 microns. Because the global unflatness of the opposing bearing surfaces (for example, the opposing surfaces of the substrate table support frame SF) is greater than 10 microns, all of the four bearings would not typically be supporting the balance mass at any given time. Thus, simply adding an extra, fourth, bearing would mean that the support forces acting on the balance mass BM could not be calculated.

Figure 7:
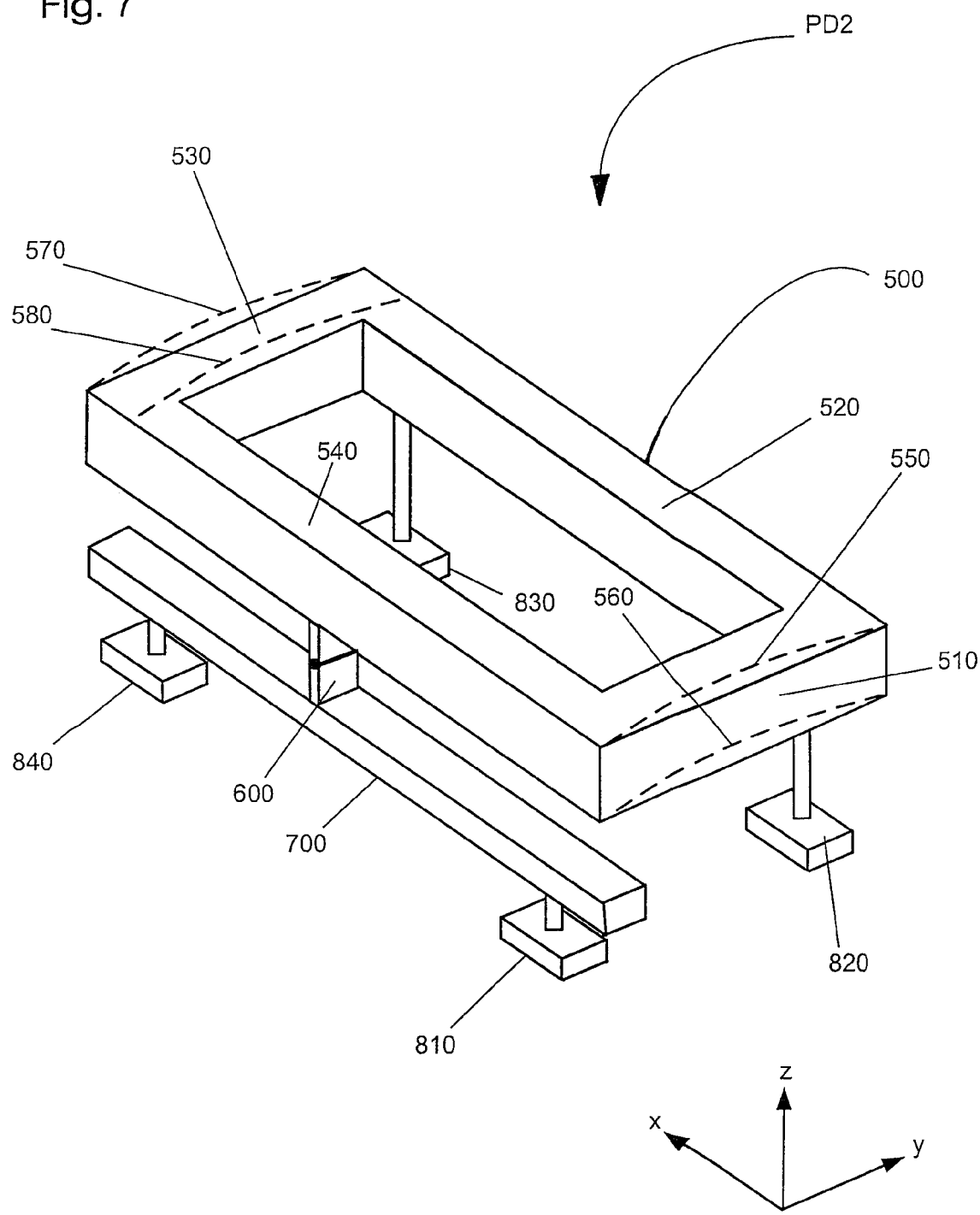
FIG. 7 depicts a substrate table positioning device according to an embodiment of the present invention.

A substrate table positioning device PD2 according to an embodiment of the present invention is shown in FIG. 7. The substrate table positioning device PD2 shown in FIG. 7 has a balance mass 500 supported on four bearings 810, 820, 830 and 840. Thus, the torsional oscillation problems discussed above in relation to a three bearing support system are eliminated. Furthermore, the stiffness in the vertical (z-axis) direction of the substrate table positioning device PD2 shown in FIG. 7 is higher than that of a three bearing support system.

The balance mass 500 may take any suitable form. However, in the embodiment shown in FIG. 7, the balance mass 500 includes a frame with its sides lying substantially in a plane. Furthermore, in the example shown in FIG. 7, the frame of the balance mass 500 is a rectangular frame having two sets of parallel opposing sides 510, 530 and 520, 540.

The substrate table positioning device PD2 shown in FIG. 7 also has a hinge 600 and a connecting member 700. The hinge 600 is connected between the balance mass 500 and the connecting member 700. The hinge 600 allows rotation, for example of the connecting member 700 relative to the balance mass 500, about an axis that is substantially parallel to the plane of the substantially rectangular frame of the balance mass 500. In the example shown in FIG. 7, the hinge 600 allows rotation of the connecting member 700 about the y-axis or the "width axis".

The bearing elements 810, 820, 830 and 840 support the balance mass 500 (for example on the substrate table support frame SF) so as to enable it to move in a substantially frictionless manner in a horizontal (i.e. x- and y-plane). In the substrate table positioning device PD2 shown in FIG. 7, two of the bearing elements 820, 830 are provided on one of the longitudinal elements 520 that extends along a length (or x-axis) direction of the balance mass frame 500. The other two bearing elements 810, 840 are provided on the connecting member 700, which is below the other longitudinal element 540 that has its longitudinal axis along the length (or x-axis) direction of the balance mass frame 500. However, other suitable positions for the bearing elements could be used.

Inserting the hinge 600 and connecting member 700 enables at least one of the bearing elements 810, 840 to move independently of the other bearing elements 820, 830. In particular, the hinge 600 and connecting member 700 allow at least one of the bearing elements 810, 840 to move independently of the other bearing elements 820, 830 in a vertical (or z-axis) direction. This means that the four bearings support structure including bearings 810, 820, 830 and 840 is statically determined. In the example shown in FIG. 7, both of the bearing elements 810, 840 on the connecting member 700 can move independently in a z-axis direction of the other two bearing elements 820, 830 by rotation about the hinge 600. Typically, the rotation of the two bearings 810, 840 on the connecting member 700 about the hinge 600 is limited to a predetermined angle. Because of the hinge 600, if one of the bearing elements 810, 840 attached to the connecting member 700 moves upwards, then the other bearing element 810, 840 attached to the connecting member 700 moves downwards.

In the arrangement of substrate table position device PD2 shown in FIG. 7, the lowest Eigen frequency mode shape of the balance mass 500 is a bending mode shape. In FIG. 7, a typical shape adopted by the frame members 510, 530 that have their longitudinal axis in the y- (width) direction in the lowest Eigen frequency mode shape is shown by dashed lines 550, 560, 570 and 580. These dashed lines are intended to show that the mode shape at the lowest Eigen frequency of the balance mass 500 is one in which the centre of the frame elements 510, 530 oscillates upwards and downwards in a vertical (z-axis) direction i.e. in a direction that is normal to the plane of the frame of the balance mass 500. The widthwise frame elements 510, 530 oscillate in phase with each other in this mode. This mode shape is in contrast to the twisting mode shape of the lowest Eigen frequency mode for the substrate table positioning device PD1 shown in FIG. 6.

The Eigen frequency at which the bending mode shape shown in FIG. 7 for the substrate table positioning device PD2 of an embodiment of the present invention occurs is higher than the Eigen frequency of the twisting mode shape that occurs in the substrate table positioning device supported by three bearings PD1 shown in FIG. 6. Typically, the lowest Eigen frequency (the bending mode Eigen frequency) of the balance mass 500 is in the range of about 40 Hz to 60 Hz. More typically, the lowest Eigen frequency of the balance mass 500 is greater than about 50 Hz. This means that the bending mode shape of the substrate table positioning device PD2 of the present invention is not excited by typical vibrations and/or movements that occur in a typical lithographic apparatus LA or lithographic cell LC. For example, it is not excited by the motion of the substrate table WT caused by the positioning actuator 20. This higher Eigen frequency, which is not excited by any vibrations or motions in a typical lithographic apparatus, enables greater positional accuracy of the substrate table, and thus the substrate.

Typically, with a structure such as that shown in FIG. 7, the length dimension of the balance mass (i.e. the length of elements 520, 540 which have their longitudinal axis in the x direction) would be approximately 0.5 meters. The gap between the frame element 540 and the connecting member 700 is typically 0.2 mm-0.3 mm. For example, this would be the typical gap between the frame element 540 and the connecting member 700 at the ends of those elements. A gap of 0.2 mm-0.3 mm would typically be sufficient to allow for variations in manufacture and/or construction within tolerance limits.

Because the lowest Eigen frequency vibration mode is not excited for the substrate table positioning device PD2 of an embodiment of the present invention, and/or because the bending mode itself is different, the frame elements 510, 530 of the balance mass 500 that extend in a width, or y-axis direction of the frame (i.e. the elements that have their longitudinal axis substantially perpendicular to the axis about which the bending mode oscillation would occur) can be made smaller and/or thinner. Indeed, these width-wise elements 510, 530 can be made to have smaller dimensions in the x, y and/or z axis directions as defined in FIG. 7. For the sake of clarification, the width-wise elements 510, 530 are not depicted in FIG. 7 as being thinner than those of FIG. 6, or than those other members 520, 540 of the balance mass frame 500. However, in reality, these width-wide members 510, 530 could be made to be smaller and/or thinner for the reasons explained herein.

Reducing the size of the width-wise balance mass elements 510, 530 provides a number or benefits. For example, it allows the substrate table WT to be inserted into position, and removed from its position, more easily. This can be beneficial, particularly in view of the spatial constraints involved in incorporating an inspection device ID into a lithographic cell LC, and the limited range of movement of the substrate handler RO discussed above. Furthermore, it allows the substrate table WT, and various other parts of the inspection device ID, to be easily accessed and removed, for example in order to be serviced.

According to an embodiment of the present invention, any arrangement of substrate table positioning device that resulted in an increase in the lowest Eigen frequency over a substrate table positioning device supported by three bearings, such as that shown in FIG. 6, could be provided. For example, any substrate table positioning device including four bearing elements in which the bearing element support structure is statically determined could be provided. As such, an embodiment of the present invention provides for any substrate table positioning device including a balance mass and four bearing elements in which two of the bearing elements support a rigid beam, the rigid beam being connected to the balance mass 500 via a single support, which could be a hinge. The hinge may allow the two bearing elements that support the rigid beam to move independently of the other two bearing elements. In an embodiment, the two bearing elements that support the rigid beam move in a vertical direction independently of the other two bearing elements.

As described herein, the hinge element 600 can be any suitable hinge element. For example, it can be any attachment device that has one degree of freedom. Typically, a simple hinge, may be used. Preferably, the hinge element 600 has just one degree of freedom. In the example shown in FIG. 7, the hinge 600 has a single rotational degree of freedom about the y-axis. The hinge 600 shown in FIG. 7 has no other degrees of freedom, and is thus stiff in all directions other than rotation about the y-axis. In other embodiments, the hinge 600 may have more than one degree of freedom, as required.

Typically the hinge 600 would be designed to last the entire life of the substrate table positioning device PD2. As such, appropriate materials would be used for the hinges 600 to account for the range of stress that they would encounter.

The hinge and/or connecting member(s) may also be provided with a stopper element to prevent excessive movement, such as rotation, of the hinge. Such a stopper element could prevent the hinge from breaking, or causing damage to other components, due to excessive rotation. Typically, the stopper element would be used to prevent excessive movement during assembly and/or disassembly. During operation, any stopper element would typically never be touched by the connecting member 700. In the example of FIG. 7, the stopper element is the frame element 540.

The substrate table positioning device PD2 according to an embodiment of the present invention has been described above in relation to positioning a substrate W in a substrate inspection device ID. In particular, it has been described in relation to positioning a substrate table WT in a substrate inspection device ID that is provided on the track of a lithographic cell LC. However, it could also be used in the positioning of the scatterometer SM used in the inspection device ID, although this is not shown in the Figures. Indeed, the substrate table positioning device according to an embodiment of the present invention is equally applicable to the positioning of any object table. For example, it may also be used in the positioning of a substrate table WT during exposure of a substrate W in a lithographic apparatus. Furthermore, a positioning device such as that described herein could be used to position other types of object table, such as the mask support table MT.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A substrate table positioning device comprising:
   a balance mass;
   first, second, third, and fourth bearings configured to movably support the balance mass on a base frame; and
   a hinge provided between the balance mass and the first and second bearings, the hinge being configured to allow the first and second bearings to move independently of the third and fourth bearings.

2. The substrate table positioning device according to claim 1, further comprising:
   a connecting member configured to rigidly connect the first bearing and the second bearing together,
   wherein the hinge is provided between the connecting member and the balance mass, such that the connecting member and the first and second bearings can rotate about the hinge.

3. The substrate table positioning device according to claim 1, wherein:
   the balance mass comprises a frame having its sides lying substantially in a plane and
   the first and second bearings are configured to be able to move independently of the third and fourth bearings in a direction that is substantially perpendicular to the plane.

4. The substrate table positioning device according to claim 3, wherein the hinge is configured to allow the first and second bearings to be rotatable about an axis that is substantially parallel to the plane.

5. The substrate table positioning device according to claim 3, wherein:
   the balance mass comprises a substantially rectangular frame having first, second, third, and fourth sides lying in the plane, the first and third sides being substantially parallel to a first direction and the second and fourth sides being substantially parallel to a second direction that is substantially perpendicular to the first direction; and
   the bearings are configured to movably support the balance mass such that the balance mass is movable in at least the first direction.

6. The substrate table positioning device according to claim 5, wherein the hinge is configured to allow the first and second bearings to be rotatable about an axis that is substantially parallel either to the first direction or the second direction.

7. The substrate table positioning device according to claim 5, wherein the substantially rectangular frame has a central opening configured to allow a substrate table to be at least partially provided therein.

8. The substrate table positioning device according to claim 5, wherein the first and second bearings are provided below the first side of the substantially rectangular frame, and the third and fourth bearings are provided below the third side of the substantially rectangular frame.

9. The substrate table positioning device according to claim 1, wherein the bearings are selected from the group comprising aerostatic bearings, hydrostatic bearings and magnetic bearings.

10. The substrate table positioning device according to claim 1, wherein the hinge is configured to allow movement in only one degree of freedom.

11. The substrate table positioning device according to claim 3, wherein the hinge is configured to restrict movement in a direction that is substantially perpendicular to the plane.

12. The substrate table positioning device according to claim 1, wherein a lowest Eigen frequency of the substrate table positioning device is between 40 and 60 Hz.

13. The substrate table positioning device according to claim 1, wherein a lowest Eigen frequency of the substrate table positioning device is above 50 Hz.

14. A substrate positioning device for a lithographic apparatus comprising:
   a substrate table positioning device comprising;
      a balance mass,
      first, second, third, and fourth bearings configured to movably support the balance mass on a base frame, and
      a hinge provided between the balance mass and the first and second bearings, the hinge being configured to allow the first and second bearings to move independently of the third and fourth bearings;
   a substrate table configured to support a substrate; and
   a positioner configured to position the substrate table by exerting forces between the balance mass and the substrate table.

15. An inspection apparatus for inspecting substrates, the inspection apparatus comprising:
   a substrate positioning device comprising:
      a substrate table positioning device comprising:
         a balance mass,
         first, second, third, and fourth bearings configured to movably support the balance mass on a base frame, and a hinge provided between the balance mass and the first and second bearings, the hinge being configured to allow the first and second bearings to move independently of the third and fourth bearings, a substrate table configured to support a substrate, and a positioner configured to position the substrate table by exerting forces between the balance mass and the substrate table;

a radiation device configured to irradiate the substrate supported by the substrate table;

a detector configured to receive radiation originating from the radiation device that has been scattered by the substrate; and a processing unit configured to analyze the received radiation, wherein the positioner is configured to move the substrate table relative to the radiation device to change a portion of the substrate that is irradiated.

16. A lithographic apparatus comprising:

a support configured to support a patterning device, the patterning device being configured to impart a radiation beam with a pattern in its cross-section to form a patterned radiation beam;

a projection system configured to project the patterned radiation beam onto a target portion of a substrate; and a substrate positioning device comprising:

a substrate table positioning device comprising:

a balance mass, first, second, third, and fourth bearings configured to movably support the balance mass on a base frame, and a hinge provided between the balance mass and the first and second bearings, the hinge being configured to allow the first and second bearings to move independently of the third and fourth bearings;

a substrate table configured to support the substrate; and a positioner configured to position the substrate table by exerting forces between the balance mass and the substrate table, wherein the positioner is configured to move the substrate table relative to the projection system to change the portion of the substrate that is the target portion.

17. A lithographic cell comprising:

a coater configured to coat a substrate with a radiation sensitive layer;

a lithographic apparatus configured to expose images onto the radiation sensitive layer of the substrate coated by the coater;

a developer configured to develop images exposed by the lithographic apparatus; and an inspection apparatus configured to inspect substrates, the inspection apparatus comprising:

a substrate positioning device comprising:

a substrate table positioning device comprising:

a balance mass, first, second, third, and fourth bearings configured to movably support the balance mass on a base frame, and a hinge provided between the balance mass and the first and second bearings, the hinge being configured to allow the first and second bearings to move independently of the third and fourth bearings, a substrate table configured to support the substrate, and a positioner configured to position the substrate table by exerting forces between the balance mass and the substrate table;

a radiation device configured to irradiate the substrate supported by the substrate table;

a detector configured to receive radiation originating from the radiation device that has been scattered by the substrate; and a processor configured to analyze the received radiation, wherein the positioner is configured to move the substrate table relative to the radiation device to change a portion of the substrate that is irradiated.

18. A device manufacturing method comprising:

transferring a pattern from a patterning device onto a target portion of a substrate; and positioning the substrate using a substrate positioning device to change the portion of the substrate that is the target portion, the substrate positioning device comprising a substrate table positioning device, the positioning of the substrate comprising:

supporting, using a substrate table, the substrate;

moving, using a positioning actuator, the substrate table;

balancing, using a balance mass, the movement of the substrate table; and supporting movably, using first, second, third, and fourth bearings, the balance mass on a base frame, allowing the first and second bearings to move independently of the third and fourth bearings on a hinge provided between the balance mass and the first and second bearings.

19. A substrate inspection method comprising:

irradiating a substrate that is supported by a substrate table;

detecting radiation that has been scattered by the substrate;

analyzing the detected radiation; and positioning the substrate using a substrate positioning device to change the portion of the substrate being inspected, the substrate positioning device including a substrate table positioning device comprising:

a balance mass, first, second, third, and fourth bearings configured to movably support the balance mass on a base frame, and a hinge provided between the balance mass and the first and second bearings, the hinge being configured to allow the first and second bearings to move independently of the third and fourth bearings;

a substrate table configured to support the substrate; and a positioner configured to position the substrate table by exerting forces between the balance mass and the substrate table.

* * * * *

UNITED STATES PATENT AND TRADEMARK OFFICE
CERTIFICATE OF CORRECTION

| | | |
|---|---|---|
| PATENT NO. | : 8,797,509 B2 | Page 1 of 1 |
| APPLICATION NO. | : 12/993460 | |
| DATED | : August 5, 2014 | |
| INVENTOR(S) | : Seijger et al. | |

It is certified that error appears in the above-identified patent and that said Letters Patent is hereby corrected as shown below:

In the Claims

Column 16, line 46, claim 14, delete ";" and insert --:--.

Signed and Sealed this
Seventeenth Day of February, 2015

Michelle K. Lee
*Deputy Director of the United States Patent and Trademark Office*